US009274152B2

(12) United States Patent
Jonsson

(10) Patent No.: US 9,274,152 B2
(45) Date of Patent: Mar. 1, 2016

(54) CURRENT-BASED CHARGE COMPENSATION IN A TOUCH SENSOR

(71) Applicant: Atmel Corporation, San Jose, CA (US)

(72) Inventor: Carl Olof Fredrik Jonsson, Gavle (SE)

(73) Assignee: Atmel Corporation, San Jose, CA (US)

( * ) Notice: Subject to any disclaimer, the term of this patent is extended or adjusted under 35 U.S.C. 154(b) by 127 days.

(21) Appl. No.: 13/753,755

(22) Filed: Jan. 30, 2013

(65) Prior Publication Data
US 2014/0210491 A1 Jul. 31, 2014

(51) Int. Cl.
*G01R 27/26* (2006.01)
*G06F 3/044* (2006.01)

(52) U.S. Cl.
CPC ............ *G01R 27/2605* (2013.01); *G06F 3/044* (2013.01)

(58) Field of Classification Search
CPC ...................................... G01R 27/26
USPC .................................. 324/661, 519
See application file for complete search history.

(56) References Cited

U.S. PATENT DOCUMENTS

| 4,687,998 | A | * | 8/1987 | Takatori | ................. H03K 4/023 327/126 |
| 7,663,607 | B2 | | 2/2010 | Hotelling | |
| 7,875,814 | B2 | | 1/2011 | Chen | |
| 7,920,129 | B2 | | 4/2011 | Hotelling | |
| 8,031,094 | B2 | | 10/2011 | Hotelling | |
| 8,031,174 | B2 | | 10/2011 | Hamblin | |
| 8,040,326 | B2 | | 10/2011 | Hotelling | |
| 8,049,732 | B2 | | 11/2011 | Hotelling | |
| 8,179,381 | B2 | | 5/2012 | Frey | |
| 2006/0170794 | A1 | * | 8/2006 | Higuchi et al. | ............... 348/241 |
| 2009/0277696 | A1 | * | 11/2009 | Reynolds et al. | .......... 178/18.06 |
| 2009/0315854 | A1 | | 12/2009 | Matsuo | |
| 2011/0001492 | A1 | * | 1/2011 | Nys et al. | ....................... 324/658 |
| 2012/0043971 | A1 | * | 2/2012 | Maharyta | ...................... 324/658 |
| 2012/0242588 | A1 | | 9/2012 | Myers | |
| 2012/0242592 | A1 | | 9/2012 | Rothkopf | |
| 2012/0243151 | A1 | | 9/2012 | Lynch | |
| 2012/0243719 | A1 | | 9/2012 | Franklin | |
| 2013/0038338 | A1 | * | 2/2013 | Lipasti | .................... G06F 3/044 324/658 |

FOREIGN PATENT DOCUMENTS

WO    WO 2012/129247    9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.
U.S. Appl. No. 13/665,520, filed Oct. 31, 2012, Lipasti.

* cited by examiner

*Primary Examiner* — Arleen M Vazquez
*Assistant Examiner* — Robert P Alejnikov, Jr.
(74) *Attorney, Agent, or Firm* — Fish & Richardson P.C.

(57) ABSTRACT

In one embodiment, a method comprises generating a first current at a current source having a magnitude based on the magnitude of a second current flowing from a capacitive node of a touch sensor in the absence of a touch with respect to the capacitive node. The method further includes generating a third current from the capacitive node of the touch sensor in the presence of a touch with respect to the capacitive node. The first current and the third current are summed to cancel out at least a portion of the third current. The method further includes integrating, by an integrator, the sum of the first current and the third current to generate an output voltage.

16 Claims, 6 Drawing Sheets

CURRENT-BASED CHARGE COMPENSATION IN A TOUCH SENSOR

TECHNICAL FIELD

This disclosure relates generally to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
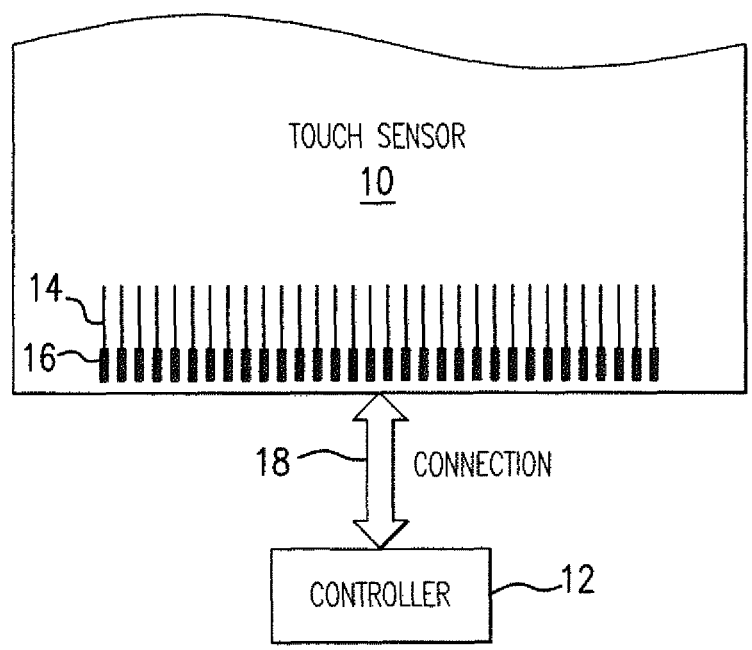
FIG. 1 illustrates an example touch sensor with an example touch-sensor controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a ground electrode, a guard electrode, a drive electrode, or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of a transparent material such as indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of one or more opaque materials such as fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

In particular embodiments, the mechanical stack containing the substrate and the drive or sense electrodes may be formed within a display panel (thus forming an in-cell sensor) or on a display panel (thus forming an on-cell sensor). In an in-cell sensor, the display may be on the same substrate as the drive or sense electrodes. The display panel may be a liquid crystal display (LCD), a light-emitting diode (LED) display, an LED-backlight LCD, or other suitable electronic display and may be visible through the touch sensor 10 that provides the touch-sensitive area. Although this disclosure describes particular display types, this disclosure contemplates any suitable display types.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 μm or less and a width of approximately 10 μm or less. As another example, one or more portions of the conductive material may be silver or silver-based and similarly have a thickness of approximately 5 μm or less and a width of approximately 10 μm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. For example, controller 12 may include a computer-readable storage medium storing logic that when executed by a processor is operable to perform one or more functions of controller 12 described herein. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2A:
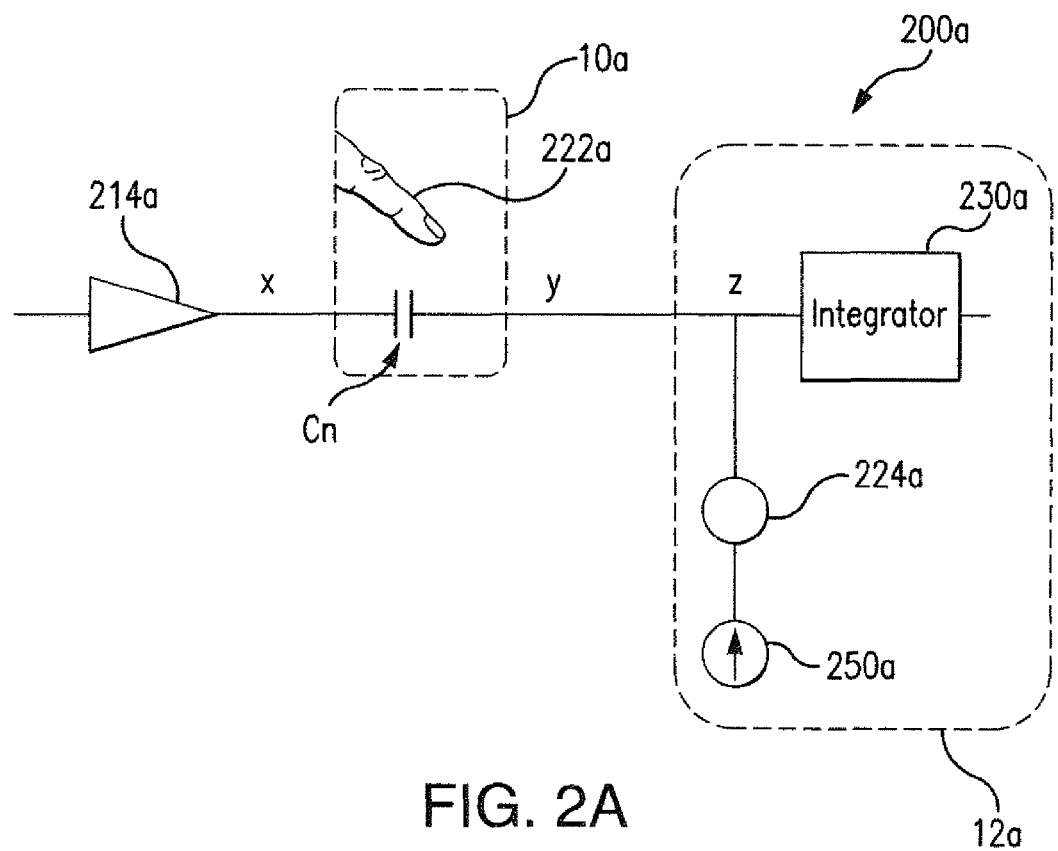
FIG. 2A illustrates an example system for compensating for charge present at a capacitive node of the touch sensor of FIG. 1.

FIG. 2A illustrates an example system 200a for compensating for charge present at a capacitive node Cn of touch sensor 10 of FIG. 1. In the example of FIG. 2A, system 200a includes a driver 214a, a portion of touch sensor 10a, and a portion of controller 12a. Controller 12a and touch sensor 10a may respectively include any suitable characteristics of controller 12 and touch sensor 10 described above. In the embodiment depicted, controller 12a includes a current source 250a, a switch 22b, and an integrator 230a. Controller 12a may be coupled to touch sensor 10a through one or more sense lines y. Current source 250a may be coupled to a sense line y at a node z.

In particular embodiments, the Current source 250a and integrator 230a may allow controller 12a to compensate for a base charge present at a capacitive node Cn. The base charge is the amount of charge present at Cn in the absence of a touch. The base charge may be caused by a drive signal sent from driver 214a. Driver 214a may transmit a drive signal to one or more drive electrodes through drive lines x. The drive signal may include one or more voltage transitions, such as a transition from a high voltage to a low voltage or vice versa. In particular embodiments, driver 214a, may be a slew rate driver, which is a driver that causes the transitions from a high voltage to a low voltage to take place over an interval of time. When driver 214a transmits a voltage transition to touch sensor 10a, charge will flow from capacitive node Cn through sense line y, producing a current. In the absence of touch, a base charge may be present at capacitive node Cn and flow through sense line y upon a drive signal voltage transition by driver 214a. In the presence of a touch 222a, a change in the effective capacitance of Cn may result from the touch absorbing or depositing charge at Cn. The change in effective capacitance of Cn when an object touches or is placed in close proximity to Cn may cause a change in the current that flows through sense line y as a result of a voltage transition by driver 214a. In typical situations, the change in effective capacitance is small, e.g., about 10 percent. Accordingly, in such a situation, the charge present at Cn when a drive signal is sent to Cn may be roughly 90 percent of the base charge. The difference between the base charge of Cn and the actual charge present at Cn during measurement is referred to herein as a delta charge. In particular embodiments, a sufficient magnitude of the delta charge may indicate a touch or proximity input with respect to Cn.

Current source 250a may be operable to generate a current that is substantially equal in magnitude to a current flowing from Cn when a charge induced by the drive signal and stored at Cn in the absence of a touch is released. However, the current generated by current source 250a has a polarity that is the opposite to the polarity of the current flowing from Cn. Accordingly, when the charge stored by Cn is released to a summing junction z (e.g., the node coupling sense line y to switch 224a), the current generated by current source 250a may cancel out the base charge flowing from Cn (e.g., the charge present at Cn in the absence of a touch). Accordingly, only the uncancelled charge is presented to integrator 210a for analysis of whether a touch has occurred. The uncancelled charge is the delta charge referred to above, that is, the difference between the base charge of Cn and the actual charge present at Cn.

Current source 250a may be operable to produce a current having variable magnitude and polarity (e.g. current source 250a may be operable as a current source and/or current sink). Switch 224a may close to cause current to flow from current source 250a during a drive signal voltage transition which causes a current in sense line y. In a particular embodiment the timing of the closure switch 224a may be adjustable so as to compensate for lag between a voltage transition and the resulting current produced in sense y.

Figure 2B:
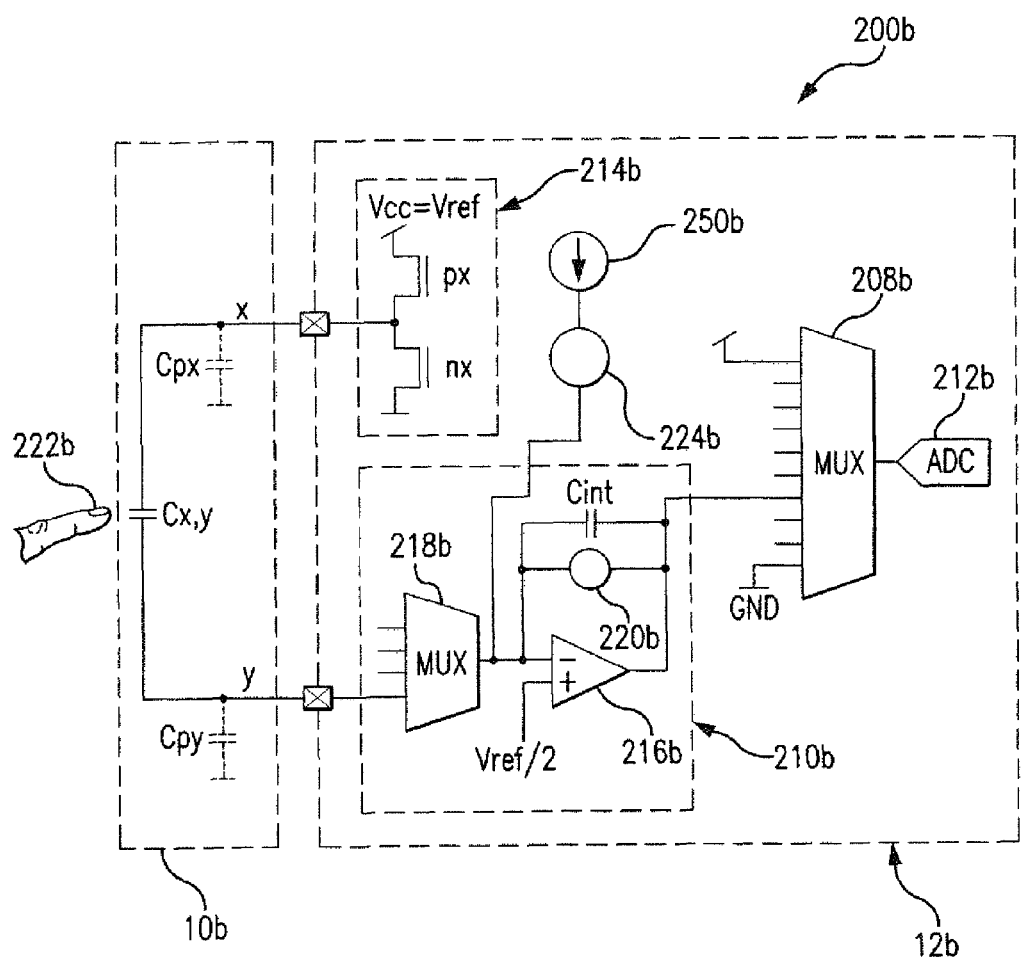
FIG. 2B illustrates an example system for compensating for charge present at a capacitive node of a mutual-capacitance implementation of the touch sensor of FIG. 1.

FIG. 2B illustrates an example system 200b for compensating for charge present at a capacitive node Cx,y of a mutual-capacitance implementation of touch sensor 10 of FIG. 1. In the example of FIG. 2B, system 200b includes portions of a controller 12b and a touch sensor 10b. Controller 12b and touch sensor 10b may respectively include any suitable characteristics of controller 12 and touch sensor 10 described above. In the embodiment depicted, controller 12b includes a compensation current source 250b, multiplexer 208b, an integration circuit 210b, an analog-to-digital converter (ADC) 212b or any other voltage-level detector, a driver 214b, and a switch 224b. Integration circuit 210b includes an operational amplifier 216b, multiplexer 218b, switch system 220b, and an integration capacitor Cint. In the embodiment depicted, Cint is coupled to a negative input terminal and the output terminal of operational amplifier 216b in parallel with switch system 220b. A positive input terminal of operational amplifier 216b is coupled to a voltage, e.g., half of a reference voltage Vref. The parallel combination of integration capacitor Cint and switch system 220b forms a feedback loop with operational amplifier 216b. Controller 12b may be coupled to touch sensor 10b through one or more drive lines x and one or more sense lines y.

In particular embodiments, the current source 250b and integration circuit 210b may allow controller 12b to compensate for a base charge present at Cx,y. The base charge is an amount of charge present at Cx,y in the absence of a touch with respect to Cx,y (e.g., when object 222b is not located near Cx,y). The base charge may be induced by a drive signal sent to Cx,y by controller 12b. When an object 222b is located in proximity to Cx,y, the object may cause a change in the effective capacitance of Cx,y by absorbing charge from Cx,y. In typical situations, the change in effective capacitance is small, e.g., about 10 percent. Accordingly, in such a situation, the charge present at Cx,y when a drive signal is sent to Cx,y may be roughly 90 percent of the base charge. The difference between the base charge of Cx,y and the actual charge present at Cx,y during measurement is referred to herein as a delta charge. In particular embodiments, a sufficient magnitude of the delta charge may indicate a touch or proximity input with respect to Cx,y.

In typical touch sensors, the charge present at Cx,y is analyzed to determine whether a touch has occurred with respect to Cx,y. In a noisy environment, the charge may need to be sampled many times for many successive drive signals in order to reliably detect a touch, because the difference between the base charge of Cx,y and the charge present during a touch is small. In various embodiments of the present disclosure, current source 250b and circuit 210b operate to remove the base charge from the measurement, such that only the delta charge is sampled and analyzed to determine whether a touch has occurred. Accordingly, if no touch is present, then a charge that is substantially zero will be collected by integration circuit 210b. However, if a touch is present, then a charge based on the delta charge is collected by integration circuit 210b for measurement. For example, the charge collected by integration circuit 210b may be the delta charge itself or an amplified version of the delta charge. In particular embodiments, amplification of the delta charge may reduce the number of measurement samples needed to reliably detect a touch at a capacitive node Cx,y. While amplification may also be utilized in situations where the entire charge at Cx,y is measured, saturation of the operational amplifier will occur much sooner, having negative effects on the accuracy of the measurements. Compensation for the base charge of Cx,y allows a touch to be detected by measuring less samples. Accordingly, various embodiments of the present disclosure may provide technical advantages such as one or more of a reduction in power consumption, an increase in measurement speed, and an increase in the accuracy of touch detection. System 200b and other related embodiments may also have the advantage of being largely immune to temperature drift such that the base charge may be accurately compensated for over a broad range of operating temperatures.

In particular embodiments, touch sensor 10b is a mutual-capacitance touch sensor that includes an array of drive electrodes and sense electrodes coupled to one of corresponding drive lines x and sense lines y respectively. Each intersection of a drive electrode and sense electrode forms a capacitive node Cx,y. Controller 12b may detect and process the change in capacitance to determine the presence and location of a touch or proximity input. Controller 12b may be one or more integrated circuits (ICs), such as for example general-purpose microprocessors, microcontrollers, programmable logic devices or arrays, application-specific ICs (ASICs). Although this disclosure describes and illustrates a particular controller in system 200b, this disclosure contemplates any suitable controller in system 200b.

Driver 214b transmits a drive signal to one or more drive electrodes through drive lines x. The drive signal may include one or more voltage transitions, such as a transition from a high voltage to a low voltage or vice versa. In particular embodiments, the high voltage is a supply voltage having a magnitude Vref that is also used as a supply voltage for any of operational amplifier 216b, or ADC 212b, and the low voltage is a ground of controller 12b. In other embodiments, any suitable high and low voltages may be used.

The drive signal may induce charge on the associated sense electrode through capacitive node Cx,y. As an example and not by way of limitation, driver 214b may be implemented as an inverter with p-type metal-oxide semiconductor (PMOS) transistor px and n-type metal-oxide semiconductor (NMOS) transistor nx. Driver 214b may also be realized through other circuits, such as an analog buffer providing predetermined voltage levels. Interaction between an object 222b and touch sensor 10b may affect an amount of charge induced on one or more sense electrodes. The induced charge is sensed as a change in capacitance by controller 12b.

Current source 250b may be operable to generate a current that is substantially equal in magnitude to a current flowing from Cx,y when a charge induced by the drive signal and stored at Cx,y in the absence of a touch is released. However, the current generated by current source 250b has a polarity that is the opposite to the polarity of the current flowing from Cx,y. Accordingly, when the charge stored by Cx,y are is released to a summing junction (e.g., the node coupling multiplexer 218b to switch 224b), the current generated by current source 250b may cancel out the base charge flowing from Cx,y (e.g., the charge present at Cx,y in the absence of a touch). Accordingly, only the uncancelled charge is presented to integration circuit 210 for analysis of whether a touch has occurred. The uncancelled charge is the delta charge referred to above, that is, the difference between the base charge of Cx,y and the actual charge present at Cx,y.

A single current source 250b and a single integration circuit 210b may be used to compensate charge for one or more capacitive nodes Cx,y and measure the delta charges stored by the capacitive nodes Cx,y. In particular embodiments, multiplexer 218b of integration circuit 210b selects one of sense lines y coupled to multiplexer 218b. Multiplexer 218b provides a path between the sense line y and integration circuit 210b such that charge flowing from capacitive node Cx,y or current source 250b may accumulate in circuit 210b for measurement. Multiplexer 218b then selects a different sense line y for measurement. In particular embodiments, multiplexer 218b selects each sense line y in accordance with a predetermined sequence.

In particular embodiments, current source 250b may be a tunable current source system comprising one or more current sources. At any suitable time, such as during production, the value of the current generated by current source 250b may be tuned to effectively cancel the charge flowing from one or more capacitive nodes Cx,y in the absence of touch. In particular embodiments, the values of capacitive nodes Cx,y that are close together generally have the same capacitance. Accordingly, current source 250b may be tuned to generate a current in accordance to this capacitance and used to compensate charge for multiple different capacitive nodes Cx,y. In some embodiments, current source 250b may be used to generate current to compensate charge for distinct capacitive nodes Cx,y that each have different capacitances. For example, a first code may set current source 250b to generate a current to cancel a charge flowing from a first capacitive node Cx,y while the first capacitive node is measured. A second code may set current source 250b to generate a current to cancel a charge flowing from a second capacitive node Cx,y while the second capacitive node is measured. Such embodiments may be useful for touch sensors that include an array of capacitive nodes (in which each capacitive node generally has the same capacitance) and one or more other capacitive nodes such as capacitive buttons, wheels, or sliders (which may have capacitances different from the capacitive nodes of the array). Any suitable number of codes with any suitable resolution may be used to tune the current generated by current source 250b. In particular embodiments, the charge compensation techniques described herein may be selectively enabled. For example, in particular embodiments, the compensation of the base charge may be turned off by opening switch 224b and turned on by closing switch 224b.

In particular embodiments, switch 224b may be used to tune the timing of when current generated by current source 250b flows to integration circuit 210b. For example, in particular embodiments, there may be a time lag between the application of a drive signal by driver 214b to Cx,y and when a charge stored at Cx,y flows to integration circuit 210b. The timing of when switch 224b may be opened or closed may be adjusted to cause the current generated by current source 250b to flow at the proper time to cancel the charge flowing from Cx,y.

In particular embodiments, the same current source 250b and integration circuit 210b may be used to compensate charge for both mutual-capacitance nodes and self-capacitance nodes and measure the delta charges present at the capacitive nodes. For example, multiplexer 218b may be coupled to one or more sense lines y that are each coupled to a sense electrode of a capacitive node and one or more lines that are each coupled to an electrode of a node that utilizes self-capacitance (e.g., Cs of FIG. 2B). In particular embodiments, the measurement sequences used to measure the delta charge of a capacitive node Cx,y utilizing mutual-capacitance and the delta charge of a capacitive node Cs utilizing self-capacitance may be different. Example sequences are described herein in connection with FIG. 3.

Integration circuit 210b may operate in multiple different modes. For example, in a first mode, switch system 220b may implement a connection between the output terminal of operational amplifier 216b and the negative input terminal of the operation amplifier, thereby bypassing integration capacitor Cint. Bypassing integration capacitor system Cint turns operational amplifier 216b into a unity gain amplifier, which drives the voltage at a negative input terminal of the operational amplifier 216, as well as the selected input of multiplexer 218b (e.g., sense line y) to the voltage of a positive terminal of the operational amplifier 216b. In the embodiment depicted this voltage is equal to have half of the reference voltage (Vref/2). Closing the feedback loop of operational amplifier 216b also removes charge stored by the integration capacitor system Cint.

As another example, in a second mode, switch system 220b coupled to the feedback loop of operational amplifier 216b is opened, forming an integrator using integration capacitor Cint and operational amplifier 216b. Opening switch system 220b couples integration capacitor Cint between the negative input terminal and the output terminal of the integrator. The integrator generates a voltage that is a function of the amount of charge transferred from the selected one of sense lines y and current source 250b. In particular embodiments, the voltage based on the amount of charge may be transmitted to ADC 212b for conversion to a digital representation of the voltage that may be processed to determine whether a touch has occurred at Cx,y.

As yet another example, in a third mode, switch system 220b is opened in a manner that reverses the polarity of the integration capacitor Cint with respect to the polarity of Cint in the second mode. For example, if a first electrode of Cint is coupled to the output of operational amplifier 216b and a second electrode of Cint is coupled to the negative input terminal of the operational amplifier in the second mode, the first electrode of Cint is coupled to the negative input terminal of the operational amplifier and the second electrode of Cint is coupled to the output terminal of the operational amplifier in the third mode.

In particular embodiments, circuit 210b enters the second mode of operation before the drive signal is transitioned (e.g., from a high voltage to a low voltage). The drive signal is transitioned and the circuit 210b integrates the sum of the resulting charge flowing from Cx,y and the current generated by current source 250b and stores the charge at Cint. Circuit 210b then enters the third mode of operation before the drive signal is transitioned back to its original value (e.g., from a low voltage to a high voltage). Circuit 210b again integrates the sum of the resulting charge flowing from Cx,y and the current generated by current source 250b and adds this to the charge already stored by Cint (reversing the polarity of Cint before integrating the charge caused by the second transition prevents the new charge from cancelling the charge already present at Cint). In particular embodiments, the voltage based on the amount of charge stored by Cint due to both transitions of the drive signal may be transmitted to ADC 212b for conversion to a digital representation of the voltage. Embodiments that involve integrating the charge induced by the drive signal on both transitions (i.e., from high to low and from low to high) may reduce or eliminate common mode interferences.

Cint may include one or more capacitors having any suitable capacitance. In particular embodiments, Cint may have substantially the same capacitance as Cx,y. In other embodiments, Cint may have a smaller capacitance than Cx,y such that the gain of operational amplifier 216b is greater than one. In such embodiments, the amplification of the delta charge may lead to more accurate measurements and power savings because less measurements are required to determine whether a touch has occurred with respect to Cx,y. In particular embodiments, the capacitance of Cint is dynamically adjustable to provide high dynamic range for the output voltage of integration circuit 210b. For example, one or more digital codes may be sent to capacitor system Cint to configure its capacitance.

Multiplexer 208b is operable to select an input and couple the input to ADC 212b. For example, in embodiments that include multiple integration circuits 210b, multiplexer 208b may select a particular integration circuit 210b for coupling to the ADC. The multiplexer 208b may iterate between the integration circuits 210b such that a voltage from each integration circuit 210b may be converted into a digital value by ADC 212b.

Figure 2C:
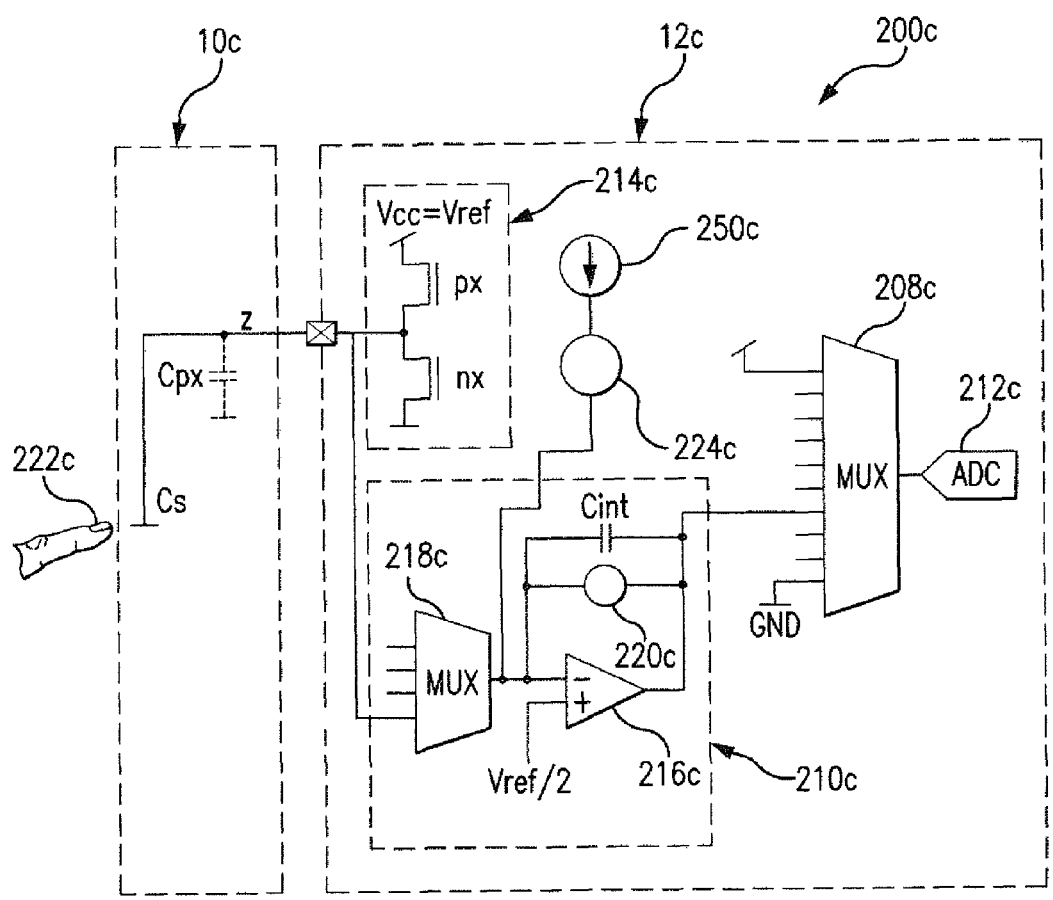
FIG. 2C illustrates an example system for compensating for charge present at a capacitive node of a self-capacitance implementation of the touch sensor of FIG. 1.

FIG. 2C illustrates an example system 200c for compensating for charge present at a capacitive node Cs of a self-capacitance implementation of the touch sensor of FIG. 1. Accordingly, capacitive node Cs of system 200c is shown with a single electrode as opposed to capacitive node Cx,y of system 200b that includes two electrodes. In the example of FIG. 2C, system 200b includes a controller 12c and a touch sensor 10c. Controller 12c includes a current source 250c, multiplexer 208c, integration circuit 210c, ADC 212c or any other voltage-level detector, a driver 214c, and a switch system 224c. Integration circuit 210c includes an operational amplifier 216c, multiplexer 218c, switch system 220c, and an integration capacitor Cint. In the embodiment depicted, Cint is coupled to a negative input terminal and the output terminal of operational amplifier 216c in parallel with switch system 220c. A positive input terminal of operational amplifier 216c is coupled to a voltage, e.g., half of a reference voltage Vref. The parallel combination of integration capacitor Cint and switch system 220c forms a feedback loop with operational amplifier 216c. Controller 12c may be coupled to touch sensor 10c through one or more lines z. Each component of FIG. 2C may have any suitable characteristics of the corresponding component of FIG. 2B. For example, touch sensor 10c, driver 214c, current source 250c, switch system 224c, integration circuit 210c, multiplexer 208c, and ADC 212c may have any suitable characteristics described above with respect to touch sensor 10b, driver 214b, current source 250b, switch system 224b, integration circuit 210b, multiplexer 208b, and ADC 212b respectively.

Self-capacitance touch sensor 10c includes one or more electrodes coupled to an associated line z that acts as a drive line and a sense line. Self-capacitance touch sensor 10c detects a presence of an object 222c through an interaction between the object 222c and an electric field generated by one or more electrodes of self-capacitance touch sensor 10c. Self-capacitance touch sensor 10c may include one or more capacitive node Cs that each include a single electrode. The self-capacitance implementation depicted by system 200c may operate in a manner that is similar to the operation of system 200b. That is, the base charge present at Cs induced by a drive signal in the absence of a touch is compensated for by a current generated by current source 250c. Accordingly, only the delta charge (e.g., the difference between the base charge and the actual charge at Cs) or an amount of charge derived from the delta charge (e.g., an amplified amount of the delta charge) is integrated by integration circuit 210c and stored in integration capacitor Cint. In various embodiments, current source 250c may be tuned to cancel out charge induced by parasitic capacitance Cpx in addition to the base charge stored by Cs. In particular embodiments, a voltage based on the amount of charge stored by Cint may be transmitted to ADC 212c for conversion to a digital representation of the voltage. An example set of operations of system 200c is described in more detail in connection with FIG. 4.

Although FIGS. 1, 2A, 2B, and 2C, have been described above as including particular components, the systems of FIGS. 1, 2A, 2B, and 2C may include any combination of any of the described components and any of the options or features described herein, as would be understood by one of ordinary skill in the art. For example, any of the options or features described herein may be utilized in combination with the illustrated embodiments of FIG. 1, 2A, 2B, or 2C or any number of the other options or features also described herein as would be understood by one of ordinary skill in the art.

Figure 3:
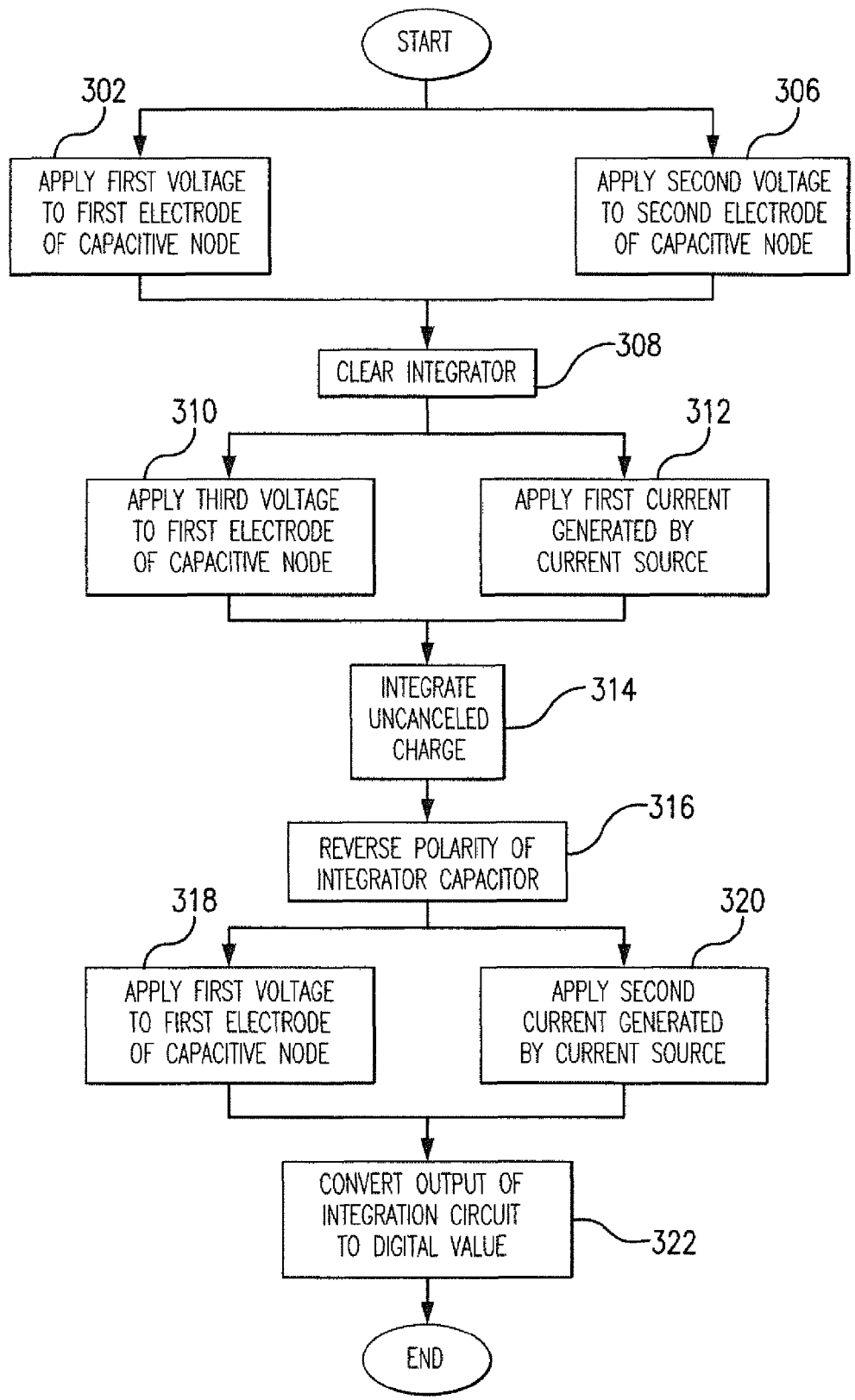
FIG. 3 illustrates an example method for compensating for charge present at a capacitive node of a touch sensor.

FIG. 3 illustrates an example method for compensating for charge present at a capacitive node of a touch sensor. The method is described with reference to system 200b of FIG. 2B, though various steps of the method may be used with alternative embodiments. The method begins at step 302, where a first voltage is applied to a first electrode of a capacitive node. For example, driver 214b may apply Vref to a drive electrode of Cx,y. At step 306, a second voltage is applied to a second electrode of the capacitive node. As an example, operational amplifier 216b may be placed in unity gain mode by closing switch system 220b. Accordingly, the output terminal of the operational amplifier is set to Vref/2. This voltage is applied to the sense electrode of Cx,y through multiplexer 218b. By maintaining the voltage of the selected one of sense lines y at substantially Vref/2 during the beginning of the charge transfer and the end of the charge transfer, the effect of parasitic capacitances Cpy on the sense lines are cancelled. In particular embodiments, the current generated by current source 250b may be tuned so as to cancel out parasitic capacitances Cpx on the drive line.

In various embodiments, both of steps 302, and 306 may be performed simultaneously. Thus, system 200b may be in a state where the drive electrode of Cx,y is set to Vref, and the sense electrode of Cx,y is set to Vref/2. At step 308, an integrator is cleared. For example, the charge of an integration capacitor of the integrator may be cleared. As an example, Cint may be cleared of charge by closing switch system 220b. In particular embodiments, step 308 may be performed simultaneously with step 306. For example, steps 306 and 308 may each be performed by closing switch system 220b. In various embodiments, steps 306 and 308 are performed before steps 302 and 304.

At step 310, a third voltage is applied to the first electrode of the capacitive node. For example, the drive signal supplied by driver 214b may transition from Vref to ground and the drive signal may be applied to the drive electrode of Cx,y. At step 312, a current is generated by a current source. For example, current source 250b may generate a current and switch 224b may be closed causing current to flow from current source current source 250b to integrator Cint. In particular embodiments, steps 310 and 312 may be performed simultaneously.

At step 314, uncancelled charge may be integrated. For example, switch system 220b may close, allowing integration circuit 210b to integrate charge flowing from Cx,y and current generated by current source 250b. In particular embodiments, at least a portion of charge flowing from Cx,y by integration circuit 210b is canceled by current generated by current source 250b. As described earlier, current source 250b may be configured to generated an amount of current that is roughly equal (and of opposite polarity) to the amount of charge flowing from Cx,y in the absence of a touch. Accordingly, when there is no touch present with respect to Cx,y, the charge flowing from Cx,y and the current generated by current source 250b may cancel each other out and substantially no charge is stored by Cint. In the case of a touch, current source 250b may generate a current that is different from the charge flowing from Cx,y due to effects caused by the touch. For example, a touch by a passive object such as a finger may decrease the amount of charge flowing from Cx,y. As another example, a touch by an active stylus may increase or decrease the amount of charge flowing from Cx,y. In a situation in which the magnitude of the current generated by current source 250b is greater than the magnitude of charge flowing from Cx,y, after all the charge flowing from Cx,y is canceled by the opposite current generated by current source 250b, the remainder of the current generated by current source 250b is integrated and stored by Cint. In a situation in which the magnitude of the current generated by current source 250b is less than the magnitude of charge flowing from Cx,y, after all the current generated by current source 250b is canceled by the opposite charge flowing from Cx,y, the remainder of the charge from Cx,y is integrated and stored by Cint. In general, the integrated charge is equal to or derived from (e.g. amplification may be performed by integration circuit 210b) the amount of the change of charge at Cx,y due to the touch (e.g., the delta charge).

At step 316, the polarity of the integrator capacitor is reversed. For example, switch system 220b may open or close one or more switches such that the polarity of integrator capacitor Cint is reversed with respect to the output terminal and negative input terminal of operational amplifier 216b. At step 318, the first voltage is again applied to the first electrode of the capacitive node. For example, driver 214b may apply Vref to the drive electrode of Cx,y. At step 320, a second current may be generated by current source. For example, current source 250b may generated an inverted current from the first current. In various embodiments, steps 318 and 320 may be performed simultaneously.

In response to the application of this voltage to Cx,y and the current generated by current source 250b, the charge received by integration circuit 210b from the charge flowing from Cx,y and the current generated by current source 250b may again be combined and the uncancelled charge is integrated and added to the charge already stored by Cint. At step 322, the output of the integration circuit is converted to a digital value.

For example, integration circuit 210b may output a voltage based on the charge stored by Cint. This voltage may be sent to ADC 212b and converted to a digital value. The digital value may be further processed to determine whether a touch has occurred at Cx,y.

Particular embodiments may repeat one or more steps of the method of FIG. 3, where appropriate. For example, the steps of the method may be performed multiple times to obtain multiple digital values that are processed together to determine whether a touch has occurred at Cx,y. Although this disclosure describes and illustrates particular steps of the method of FIG. 3 as occurring in a particular order, this disclosure contemplates any suitable steps of the method of FIG. 3 occurring in any suitable order. Moreover, although this disclosure describes and illustrates particular components, devices, or systems carrying out particular steps of the method of FIG. 3, this disclosure contemplates any suitable combination of any suitable components, devices, or systems carrying out any suitable steps of the method of FIG. 3.

A compensation method for a self-capacitance implementation may also include any one or more of the steps of the method of FIG. 3. In particular embodiments, a compensation method for a self-capacitance implementation may involve a process that is different from the process performed for a mutual-capacitance implementation.

Figure 4:
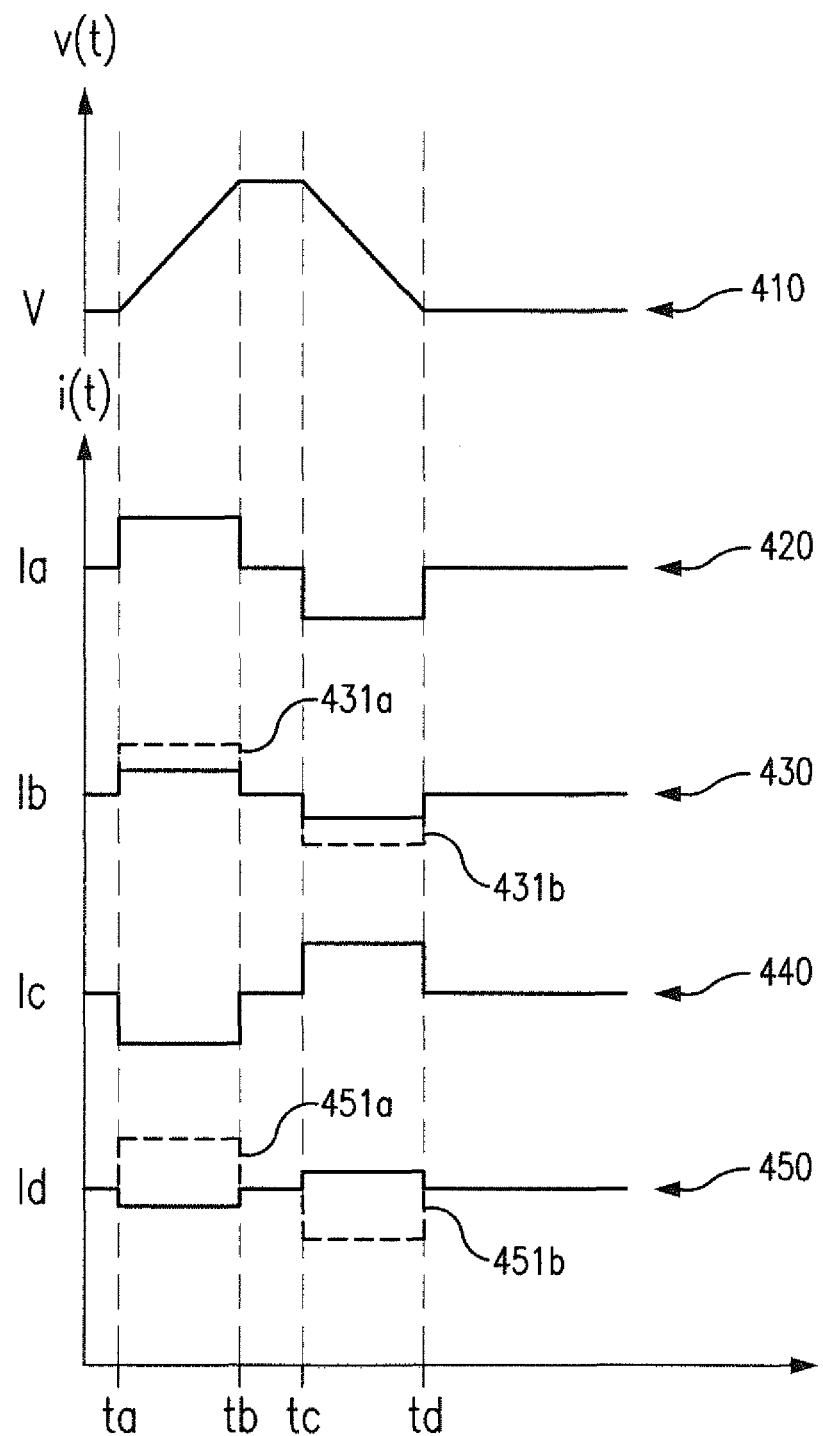
FIG. 4 illustrates graphs showing example voltage and current transitions in a system for current-based charge compensation in a touch sensor.

FIG. 4 illustrates graphs showing example voltage and current transitions with in a system for current-based charge compensation in a touch sensor, with reference to FIG. 2A. FIG. 4 shows a voltage transition graph 410, a base current graph 420, a touch current graph 430, a compensation current graph 440, and a delta current graph 450.

Voltage transition graph 410 illustrates a voltage transition cause by driver 214a. At time Ta driver 214a causes the voltage applied to capacitive node Cn to begin to increase. At time Tb the voltage has been driven to a high value. At time Tc driver 214a begins to drive the voltage applied to capacitive node Cn to a low value. At time Td the voltage has been driven to a low value.

Base current graph 420 illustrates a base current Ia flowing through sense line y from capacitive node Cn as a result of the voltage transition as illustrated in graph 410. At time Ta the voltage transition begins causing the base charge to flow from capacitive node Cn through sense line y as a current. At time Tb the voltage transition has finished resulting in no net current flowing from capacitive node Cn through sense line y. At time Tc the voltage begins a transition back to a low value, causing a current to flow through sense line y of opposite polarity to the current resulting from the transition to high voltage. At time Td the voltage transition is complete resulting in a return to no net current flowing through sense line y.

Touch current graph 430 illustrates a current in the presence of a touch, Ib, flowing through sense line y from capacitive node Cn as a result of a the voltage transition as illustrated in graph 410. At time Ta the voltage transition begins causing the charge to flow from capacitive node Cn through sense line y as a current. At time Tb the voltage transition has finished resulting in no net current flowing from capacitive node Cn through sense line y. At time Tc the voltage begins a transition back to a low value, causing a current to flow through sense line y of opposite polarity to the current resulting from the transition to high voltage. At time Td the voltage transition is complete resulting in a return to no net current flowing through sense line y. Boxes 431a and 431b indicate the delta current upon a transition from low to high voltage and upon a transition from high to low voltage respectively, that is the difference in current between the base current shown in base current graph 420 and the current in the presence of a touch Ib.

Base current graph 440 illustrates a current generated by current source 250a to compensate for a base current produced in sense line y by capacitive node Cn as a result of the voltage transition as illustrated in graph 410. At time Ta the voltage transition begins causing the base charge to flow from capacitive node Cn through sense line y as a current. At time Ta, current source 250a produces a current having an opposite polarity to the base current illustrated in graph 420. At time Tb the voltage transition has finished resulting in no net current flowing from capacitive node Cn through sense line y. At time Tb switch 224a may operate to disconnect current source 250a from the sense line. At time Tc the voltage begins a transition back to a low value, causing a current to flow through sense line y of opposite polarity to the current resulting from the transition to high voltage. At time Tb current source 250a reverses the polarity of the current it produced at time Ta to produces a current having an opposite polarity to the base current illustrated in graph 420. At time Td the voltage transition is complete resulting in a return to no net current flowing through sense line y. At time Td switch 224a my operate to disconnect current source 250a from the sense line.

Delta current graph 450 illustrates the current flowing through node z to integrator 210a in the presence of a touch 222a as a result of a voltage transition as illustrated in graph 410. The base current as shown in graph 420 is summed at node z with the compensation current produced by current source 250a as shown in graph 440. As a result, the base current and the compensation current cancel each other out. This leaves only the delta current, which indicates the change in effective capacitance on capacitive node Cn caused by a touch, to be passed to through node z to integrator 230a. Boxes 451a and 451b illustrate the base current which is canceled out by the compensation current during the voltage transitions between times Ta and Tb and times Tc and Td, respectively.

Herein, reference to a computer-readable storage medium encompasses one or more non-transitory, tangible computer-readable storage media possessing structure. As an example and not by way of limitation, a computer-readable storage medium may include a semiconductor-based or other IC (such, as for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus comprising:
a touch sensor controller operable to:
apply a first voltage to a drive line of a touch sensor;
initiate a transition of the first voltage applied to the drive line to a second voltage;
apply a reference voltage from a follower to a sense line of the touch sensor, the first voltage applied to the drive line being transitioned to the second voltage, wherein the reference voltage is applied at a time during the transition such that parasitic capacitance on the sense line is cancelled as a result of the reference voltage;
perform a summing of a first current received from the sense line in response to the voltage transition applied to the drive line and a second current generated by a current source, the summing canceling out at least a portion of the first current;
integrate a sum of the first current and the second current to generate an output voltage; and
determine, based on the output voltage, whether a touch has occurred with respect to a capacitive node associated with the drive line and the sense line.

2. The apparatus of claim 1, wherein the reference voltage is half of a supply voltage of the touch-sensor controller.

3. The apparatus of claim 1 wherein the touch-sensor controller is further operable to:
reverse a polarity of a capacitor system; and
integrate a sum of a third current received from the sense line and a fourth current generated by the current source.

4. The apparatus of claim 1, the touch-sensor-controller further operable to:
clear the sum of the first current and the second current; and
integrate a sum of a third current received from a second sense line of the touch sensor and a fourth current generated by the current source.

5. The apparatus of claim 1, wherein integrating the sum of the first current and the second current comprises coupling an integration capacitor between an input terminal and an output terminal of an operational amplifier.

6. The apparatus of claim 1, wherein the first voltage is a supply voltage of the touch-sensor controller and the second voltage is a ground of the touch-sensor controller.

7. The apparatus of claim 1, wherein a magnitude and a timing of an output of the current source are adjustable.

8. A method comprising:
generating a first current from a current source, the first current having a magnitude based on the magnitude of a second current present at a capacitive node of a touch sensor in the absence of a touch with respect to the capacitive node;
generating a third current at the capacitive node of the touch sensor in the presence of a touch with respect to the capacitive node by transitioning a voltage applied to a drive line coupled to the capacitive node of the touch sensor from a first voltage to a second voltage;

applying a reference voltage from a follower to a sense line coupled to the capacitive node of the touch sensor while the third current is generated, wherein the reference voltage is applied at a time during the transition such that parasitic capacitance on the sense line is cancelled as a result of the reference voltage;

summing the first current and the third current to cancel out at least a portion of the third current; and integrating the sum of the first current and the third current to generate an output voltage.

9. The method of claim 8, wherein a magnitude and a timing of an output of the current source are adjustable.

10. The method of claim 8, further comprising:

reversing a polarity of a capacitor system; and integrating a sum of a fourth current received from the capacitive node of the touch sensor and a fifth current received from the current source.

11. The method of claim 8, further comprising:

communicating the output voltage to an analog-to-digital converter; and converting the output voltage to a digital value.

12. The method of claim 8, further comprising:

clearing the sum of the first and the third current; and integrating a sum of a fourth current received from a second capacitive node of the touch sensor and a fifth current received from the current source.

13. A circuit comprising:

a current source configured to generate a first current having a magnitude based on a magnitude of a second current generated at a capacitive node of a touch sensor in the absence of a touch with respect to the capacitive node;

a junction configured to sum the first current and a third current generated at the capacitive node of the touch sensor in the presence of a touch with respect to the capacitive node, where the third current is generated by transitioning a voltage applied to a drive line coupled to the capacitive node of the touch sensor from a first voltage to a second voltage, the summation cancelling out at least a portion of the third current; and an integrator configured to integrate the sum of the first current and the third current to generate an output voltage, where a reference voltage is applied to a sense line coupled to the capacitive node of the touch sensor while the third current is generated, and wherein the reference voltage is applied at a time during the transition such that parasitic capacitance on the sense line is cancelled using the reference voltage.

14. The circuit of claim 13, wherein a magnitude and a timing of an output of the current source are adjustable.

15. The circuit of claim 13, wherein the integrator is further configured to:

reverse a polarity of a capacitor system of the integrator; and integrate the sum of a fourth current received from the capacitive node of the touch sensor and a fifth current received from the current source.

16. The circuit of claim 13; wherein the integrator is further configured to:

clear the sum of the first current and the third current; and integrate a sum of a fourth current received from a second capacitive node of the touch sensor and a fifth current received from the current source.

* * * * *

UNITED STATES PATENT AND TRADEMARK OFFICE
CERTIFICATE OF CORRECTION

PATENT NO. : 9,274,152 B2  
APPLICATION NO. : 13/753755  
DATED : March 1, 2016  
INVENTOR(S) : Carl Olof Fredrik Jonsson Page 1 of 1

It is certified that error appears in the above-identified patent and that said Letters Patent is hereby corrected as shown below:

In the specification,

Column 12, Line 36; Delete "FIG." and insert -- FIGS. --, therefor.

Column 14, Line 53; Delete "of a the" and insert -- of the --, therefor.

In the claims,

Column 18, Line 26; In Claim 16, delete "claim 13;" and insert -- claim 13, --, therefor.

Signed and Sealed this  
Twenty-fourth Day of May, 2016

Michelle K. Lee  
*Director of the United States Patent and Trademark Office*